United States Patent [19]

Nishiyama et al.

[11] Patent Number: 4,482,393
[45] Date of Patent: Nov. 13, 1984

[54] METHOD OF ACTIVATING IMPLANTED IONS BY INCOHERENT LIGHT BEAM

[75] Inventors: Kazuo Nishiyama, Kanagawa; Tetsunosuke Yanada, Tokyo; Michio Arai, Kanagawa, all of Japan

[73] Assignee: Sony Corporation, Tokyo, Japan

[21] Appl. No.: 216,273

[22] Filed: Dec. 15, 1980

[30] Foreign Application Priority Data

Dec. 17, 1979 [JP] Japan .................................. 54-163746

[51] Int. Cl.$^3$ ........................................ H01L 21/265
[52] U.S. Cl. .................................. 148/1.5; 29/576 B; 29/576 T; 148/187; 357/91
[58] Field of Search ................... 148/1.5, 187; 357/91, 357/18; 29/576 B, 576 T

[56] References Cited

U.S. PATENT DOCUMENTS

| | | | |
|---|---|---|---|
| 3,692,572 | 9/1972 | Strehlow | 117/201 |
| 3,763,348 | 10/1973 | Costello | 362/217 |
| 4,081,313 | 3/1978 | McNeilly et al. | 148/175 |
| 4,229,232 | 10/1980 | Kirkpatrick | 148/1.5 |
| 4,331,485 | 5/1982 | Gat | 148/1.5 |

OTHER PUBLICATIONS

Nishiyama et al., Jap. Jour. Appl. Physics, 19, (Oct. 1980), p. L-563.
Lever, IBM-TDB, 20, (1978), 3908.
Chicotka et al., IBM-TDB, 13, (1971), 3788.
Powell et al., J. Vac. Sci. Technol., 20, (Jan. 1982), 33.
Lau et al., Appl. Phy. Letts., 35, (Aug. 15, 1979), 327.
Miyao et al., Appl. Phys. Letts., 35, (Aug. 1, 1979), 227.
Fang et al., IBM-TDB, 22, (Aug. 1979), 1236.
Cohen et al., Appl. Phys. Letts., 33 (8), (Oct. 1978), 751.
Bomke et al., Appl. Phys. Letts., 33 (11), (1978), 955.
Poate et al., Radiation Effects, 48, (1980), 167.
Von Gutfeld, IBM-TDB, 19, (1977), pp. 3955-3956.

Primary Examiner—Upendra Roy
Attorney, Agent, or Firm—Hill, Van Santen, Steadman & Simpson

[57] ABSTRACT

A process of manufacturing a semiconductor device having the steps of implanting impurity ions to a surface of a semiconductor substrate; and radiating the substrate with incoherent light of which scope is wider than said substrate whereby the implanted region is electrically activated.

5 Claims, 5 Drawing Figures

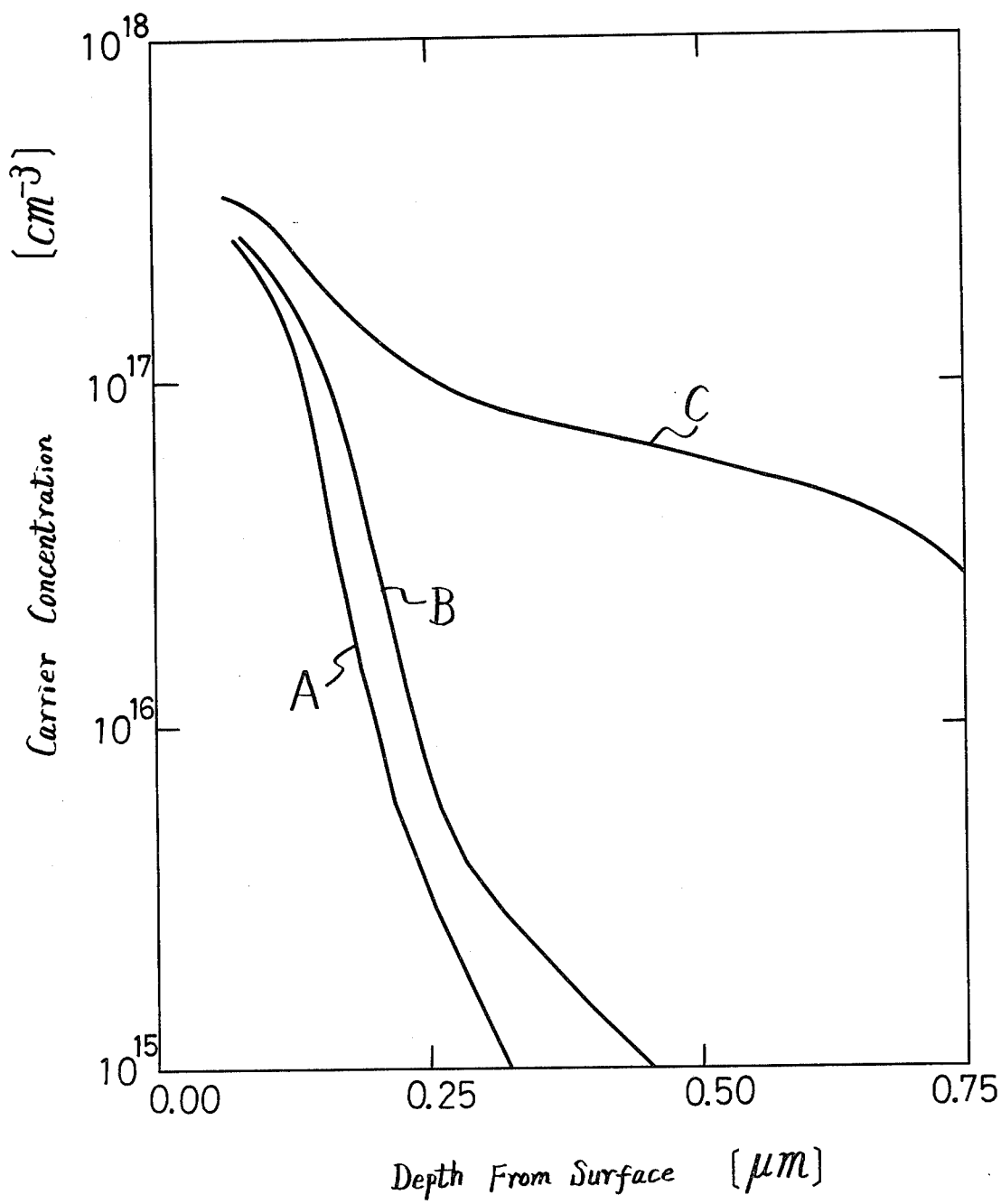

METHOD OF ACTIVATING IMPLANTED IONS BY INCOHERENT LIGHT BEAM

BACKGROUND OF THE INVENTION

1. Field of the Invention:

The present invention relates generally to a process for manufacturing a semiconductor device and is directed more particularly to a process for manufacturing a semiconductor device in which a semiconductor substrate implanted with ions is annealed in a short period of time to form an electrically activated region thereon.

2. Description of the Prior Art:

A prior art technique, in which the crystal defects in an ion implanted region is restored to electrically activate the implanted atoms or ions, is typically an annealing method using an electrical furnace. This prior art method is such that a number of semiconductor substrates implanted with ions are set on a quartz board or the like and then are subjected to the heating process within an electrical furnace at, for example, 800° to 1200° C. for more than 10 minutes to provide an electrically activated region in each of the substrates.

This method is productive in view of the fact that a number of substrates can be processed at the same time, but is defective in view of the fact that since the substrates to be annealed have large thermal capacity, non-uniformity is generated in electrically activated layers which are provided in a short period of heating.

Further, even in the case where the controllability of the profile of an ion implanted region is attempted to be utilized in making a semiconductor element, redistribution phenomenon is generated in the ion implantation profile by the prior art long time heating. As a result, the advantage of the ion implantation is damaged.

Further, upon manufacturing a semiconductor device thermally unstable such as GaAs compound semiconductor atoms such as Ga, As forming the substrate are vaporized during long time heating at high temperature to form a thermal conversion layer on the surface of the substrate which damages the electrical activation of the ion implanted region.

Recently, as a new annealing processing method for an ion implantation region, a laser anneal method, for example, has been studied which can electrically activate an ion implanted region in a very short period of time (such as in a nano second to a micro second). The mechanism thereof is considered that a semiconductor substrate absorbs the energy of laser light and converts the same to heat energy to achieve the annealing process for the substrate. In this case, however, the light absorption coefficient of the semiconductor substrate much depends on the wave length of the laser light and also on the crystal property of the semiconductor substrate (varied in response to the amount of implanted ions), which requires that the laser output must be changed in accordance with semiconductor substrates to be annealed.

Further, when a laser light is radiated on a multilayer structure such as $SiO_2$—Si structure, polycrystalline Si—Si structure and so on to anneal the same, there is the reflection of the laser light on, for example, the surface of Si and an interference effect determined by the wave length of the laser light, the thickness of a $SiO_2$ layer on Si and so on. Hence, the laser output during annealing must be different.

According to the present anneal by laser light, a laser beam is focussed with several 10 μm scans a semiconductor substrate in two dimension to anneal it uniformly. However, no uniform anneal is achieved due to the fluctuation, flicker or the like of the laser light. If a semiconductor substrate can be radiated by a laser with a large spot, this case, however, requires a very intensive laser output.

OBJECTS AND SUMMARY OF THE INVENTION

Accordingly, an object of the present invention is to provide a novel process for manufacturing a semiconductor device.

Another object of the invention is to provide a process for manufacturing a semiconductor device using a new annealling method by an incoherent light radiation to activate an ion implanted region.

A further object of the invention is to provide a process for manufacturing a semiconductor device in which an ion is implanted in the surface of a semiconductor substrate and then incoherent light from a lamp is radiated on the ion implanted semiconductor surface to anneal the surface to thereby activate the ion implanted region. A wide angle beam of the light enables the annealing without the necessity of beam scanning.

A further object of the invention is to provide a process of manufacturing a semiconductor device using the annealling by the radiation of incoherent light by which the ion implanted region can be electrically activated in a shorter period of time by two figures ($10^{-2}$) as compared with the anneal using the electrical furnace and hence the problems caused by a long time anneal can be avoided.

According to an aspect of the present invention, there is provided a process of manufacturing a semiconductor device which comprises the steps of:

(a) implanting impurity ions in a surface of a semiconductor substrate; and (b) radiating incoherent light with a beam angle which is wider than said substrate, whereby the implanted region is electrically activated.

The other objects, features and advantages of the present invention will become apparent from the following description taken in conjunction with the accompanying drawings.

BRIEF DESCRIPTION OF THE DRAWINGS

FIG. 5 is a graph showing the carrier concentration profile of a semiconductor wafer in which the thermal conversion appears.

DESCRIPTION OF THE PREFERRED EMBODIMENTS

The present invention will be hereinafter described with reference to examples and the attached drawings.

Figure 1:
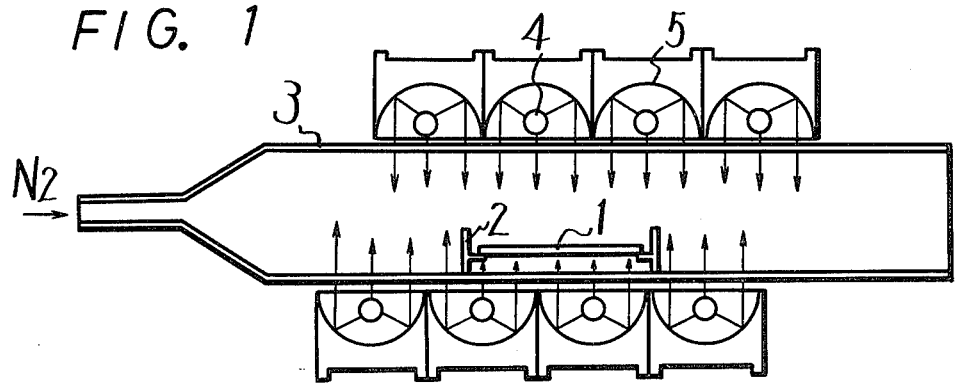
FIG. 1 is a cross-sectional view showing an example of the heating apparatus of a uniform radiation type which uses mirrors each having a paraboloidal reflecting surface and is usable for carrying out the process according to the present invention.

FIG. 1 shows in cross-section a heating apparatus of incoherent light radiation in which paraboloidal reflecting mirrors are used. In FIG. 1, 1 designates a semiconductor wafer on the surface of which ions are implanted, 2 a ring-shaped suspender made of quartz and supporting the semiconductor wafer 1 through, for example, four thin projections 2a so as for only the wafer 1 to be effectively heated. Two wafers 1 may be superimposed with their front or back surfaces in contact with each other and then supported by the suspender 2. The suspender 2 supporting the wafer 1 is housed in a quartz tube 3 having the cross-section of a rectangular shape. A plurality of suspenders 2 may be disposed in the quartz tube 3. In the figure, 4 designates a radiation lamp made of, for example, tungsten-halogen lamp which will radiate a visual and infrared light with the wave lengths of 4 $\mu$m, and 5 a mirror having a paraboloidal reflecting surface. A pair of sets of lamp 4 and reflecting mirror 5 are located above and below the quartz tube 3 along the longer sides of the quartz tube 3. In this case, for example, four sets of the lamp 4 and mirror 5 are located at each of the upper and lower sides of the quartz tube 3 and each set of lamps 4 above and below the quartz tube 3 are complementarily displaced so as to uniformly radiate the substrate.

Upon the practical use of the above heating apparatus, the semiconductor wafer 1 which is supported by the suspender 2 is disposed in the quartz tube 3 and $N_2$ gas is introduced into the quartz tube 3 at the flow rate of 2 l/min to avoid the oxidization of the semiconductor wafer 1. In this case, the light absorption coefficient of quartz is low. Therefore, in this heating apparatus, the heating for the wafer 1 is not carried out by the radiation from the quartz tube as in the ordinary electrical furnace, so that contamination by sodium ions or the like is diminished.

According to the heating apparatus shown in FIG. 1, the semiconductor wafer 1 can be heated rapidly at a high rate unlike the thermal conduction from a susceptor of large thermal capacity as occurs in the prior art electrical furnace.

Figure 2:
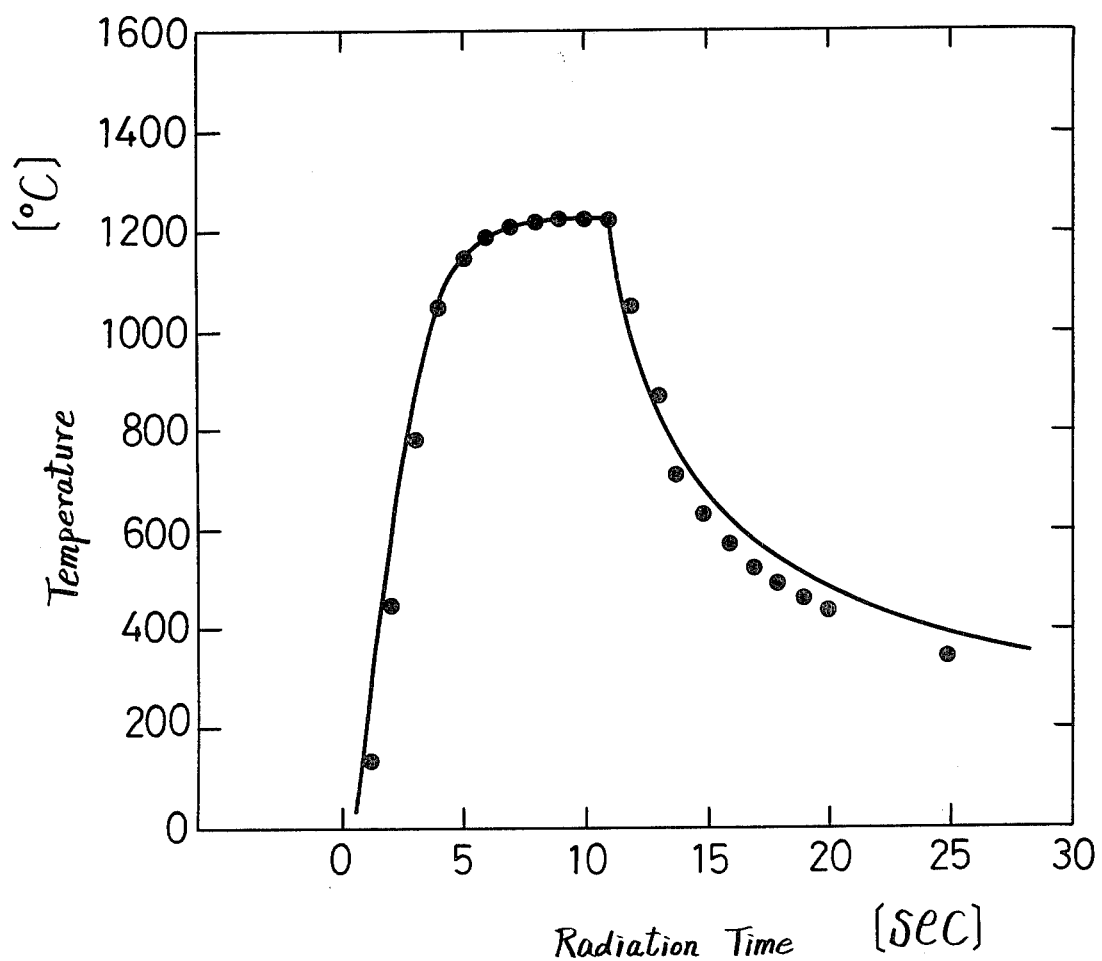
FIG. 2 is a graph showing the temperature to radiation characteristic of a semiconductor wafer by the heating apparatus shown in FIG. 1.

As will be apparent from the graph of FIG. 2 showing the temperature rising of the above heating apparatus, the temperature on the wafer 1 reaches 1200° C. within about 6 seconds from the start of light radiation. In the case of the graph of FIG. 2, the input power is 20 Wcm$^{-2}$ and emissivity is 0.5, and in the graph of FIG. 2, the black dots represent experimental values and the line shows a theoretical value, respectively. Therefore, in this case, it is sufficient that the radiation time within which light is radiated within about 10 seconds and that the temperature can be determined by the radiation time period of light. Thus, it becomes unnecessary to control the temperature by using a thermo couple in this case.

Further, according to the above heating apparatus, only the wafer 1 is heated so that the sheet resistance thereof is uniform and warp is less in the wafer 1.

In addition to the above heating apparatus, such a heating apparatus may be used for carrying out the process of the invention in which a semiconductor wafer continuously moves through the radiating area therein along an air-cushioned track, or a heating apparatus is provided integral with an ion implanting apparatus such that ions are implanted in a semiconductor wafer and thereafter the wafer is annealed in the same chamber. Further, in place of the mirror with the paraboloidal reflecting surface, a mirror with an ellipsoidal reflecting surface may be used to focus the light.

The anneal time by the heating apparatus is about several seconds, so that the ion implanted region can be electrically activated without redistribution and a shallower junction can be formed.

When a semiconductor device such as a GaAs compound semiconductor device which is thermally unstable is manufactured, its ion implanted region can be activated in a short time period by the light radiation anneal. Thus, in this case, the vaporization of Ga or As and also the diffusion of Cr can be suppressed, hence, the generation thermal conversion layer is avoided and the profile of impurity by the ion implantation is not damaged.

Further, when the anneal by the incoherent light radiation according to the present invention is applied to a multi-layer semiconductor wafer such as Si—SiO$_2$ structure, Si - polycrystalline Si structure or the like, since the wave length of the tungsten-halogen lamp light is in the range of 0.4 to 4 $\mu$m, the wave interference effect, which causes a problem in the laser anneal, can be neglected.

EXPERIMENTAL EXAMPLE 1

To the surfaces (100), (111) of Czochralski crystal wafer of Si in the N-type, implanted are B+ions with the energy of 200 KeV and the dose amount of $10^{15}$ cm$^{-2}$. Then, this wafer is radiated by the tungsten-halogen lamp light using the heating apparatus shown in FIG. 1 with the lamp input of 35 W cm$^{-2}$.

Figure 3:
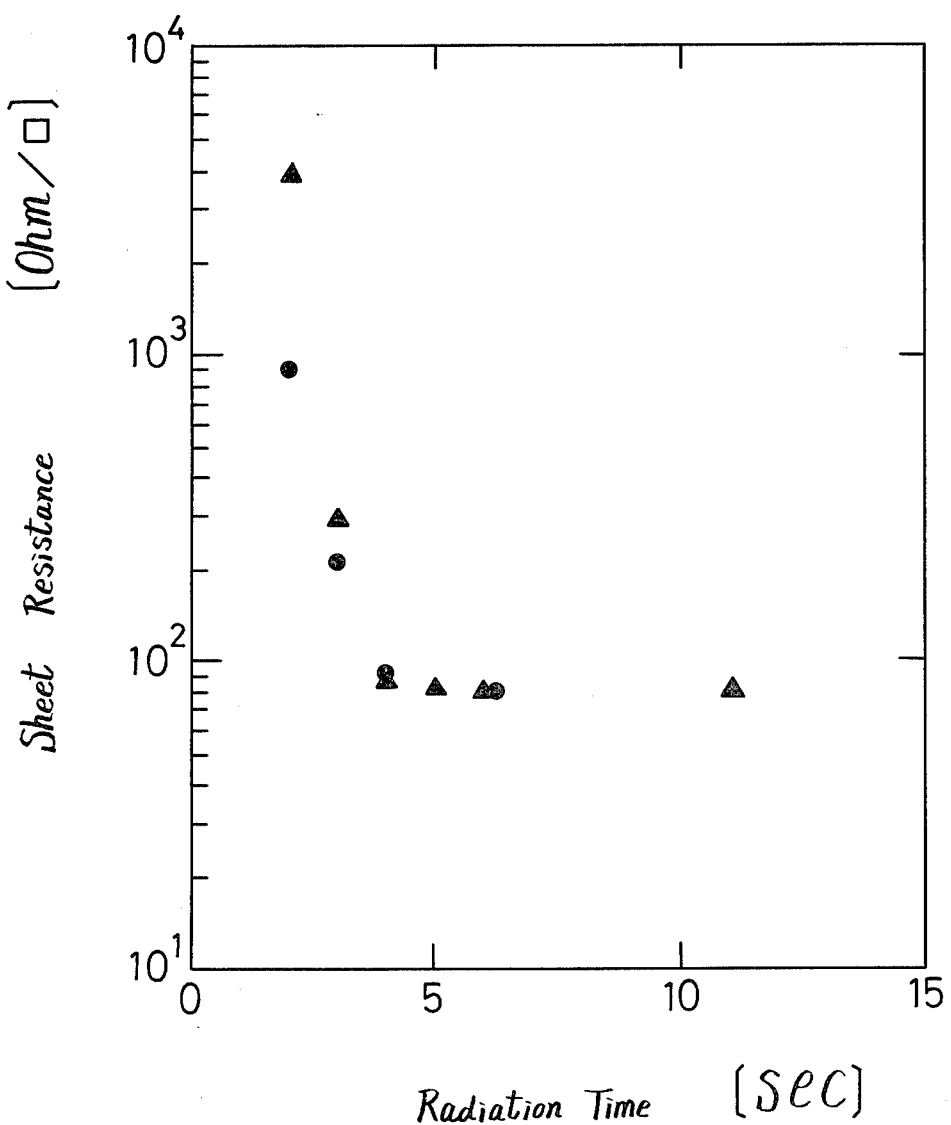
FIG. 3 is a graph showing the relation between the time of the lamp radiation on a semiconductor wafer and the sheet resistance thereof.

FIG. 3 is a graph showing the relation of the light radiation time to the sheet resistance of the wafer surface. In the graph of FIG. 3, the black dots show the wafer with the (100) surface and the resistivity of 40 to 80 $\Omega$cm, and the black triangles show the wafer with the (111) surface and the resistivity of 60 to 80 $\Omega$cm, respectively.

According to the electrical furnace annealing, for example, at 1100° C. and for 15 minutes, the sheet resistance of a semiconductor wafer is about 80 $\Omega/\square$ (ohm per unit area). Therefore, it will be understood that, according to the above example of the invention, a semiconductor wafer having the characteristic similar to that of the prior art can be produced by the radiation of light for about 6 seconds.

Figure 4:
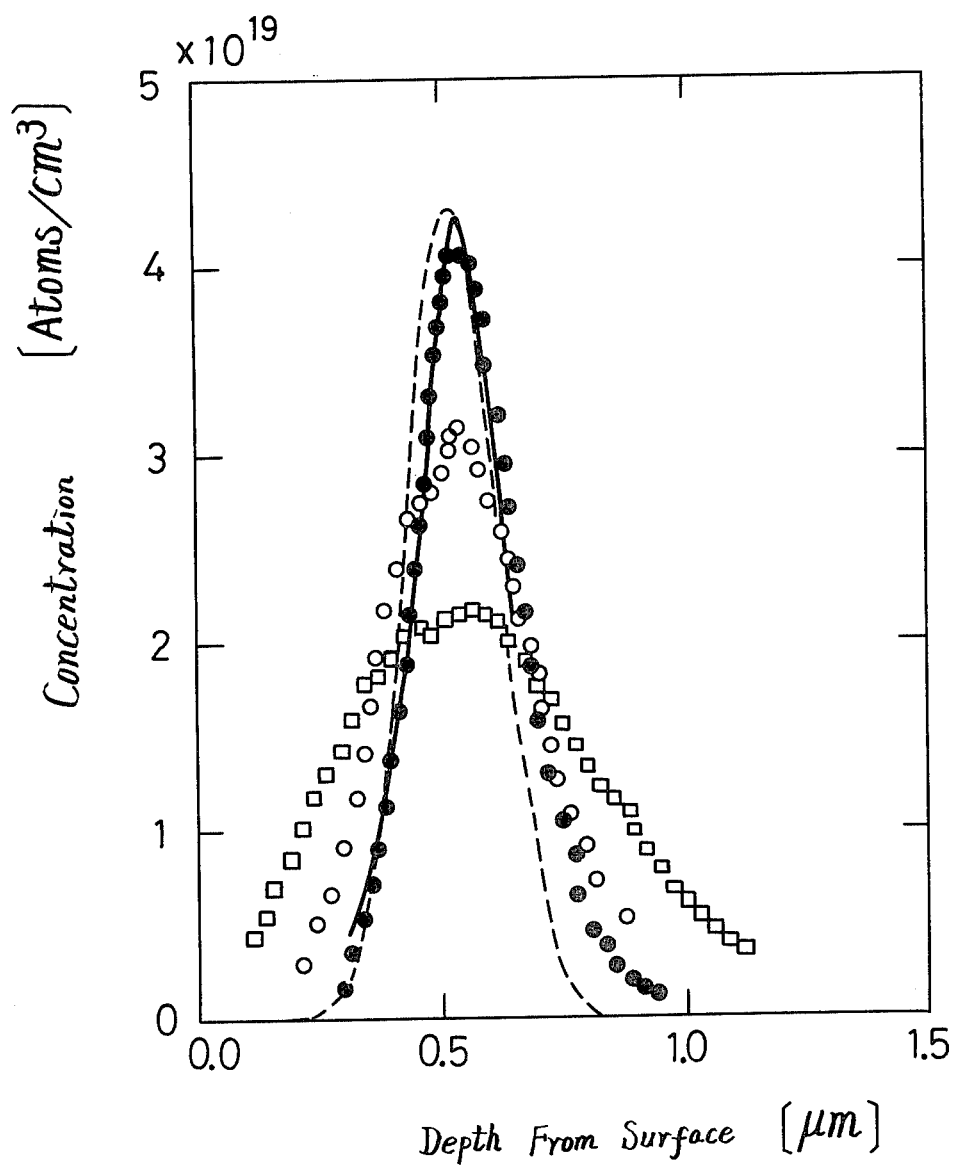
FIG. 4 is a graph showing the boron concentration profile of a (111) surface semiconductor wafer.

FIG. 4 is a graph showing the concentration profile of boron in the (111) surface a semiconductor wafer. In the graph of FIG. 4, the solid line represents the profile as implanted with boron in the wafer and the broken line the theoretical value thereof, respectively. Further, in this graph the black dots show the case where the light is radiated in 6 seconds, while the white dots and rectangles the cases where wafers are heated at 1000° C. and 1100° C. for 15 minutes in an electrical furnace. Therefore, it is understood that little rediffusion of impurities occurs by the light anneal, and the distribution of the sheet resistance within the wafer is within 1.2%.

Si+ions are implanted in a wafer of GaAs with Cr doped thereinto with the energy of 70 KeV and the dose amount of $3 \times 10^{12}$ cm$^{-2}$ and the halogen lamp light is radiated on the wafer by using the heating apparatus of FIG. 1. In this case, the GaAs wafer is placed on a substrate such as of silicon, which has smooth surfaces, absorbs the radiated light and is suspended by the quartz suspender 2 as in FIG. 1, with its implanted surface down and contacting the upper surface of the silicon substrate. This is to conduct heat to the GaAs wafer and to avoid the evaporation of As. In the case of the GaAs wafer having Cr doped thereinto, excess carriers are generated by the out diffusion of Cr and N-type thermal conversion is apt to be generated therein.

FIG. 5 is a graph showing the comparison of carrier profiles of wafers which are especially prone to be thermally converted. In the graph of FIG. 5, curves A and B show the case heated by the light up to 940° C. and at that instant the radiation is stopped and that heated by the light up to 900° C. and the radiation thereof is kept for ten seconds, respectively, while a curve C shows the case where a wafer is heated in an electrical furnace at 850° C. for 15 minutes. From the graph of FIG. 5 it will be understood that according to the light anneal little excess carriers are seen and the carrier profile is sharp.

In addition, the present heating apparatus can be applied to such a heating process that an insulating layer for passivating the surface of a GaAs wafer during annealing is formed before annealing. In this case, $SiH_4$, $O_2$ and so on are introduced to the same quartz tube of the heating apparatus in which the wafer is located, and after the gas flow becomes stable, the light is radiated on the wafer to heat the same at 400° to 500° C. for several seconds to thereby make a $SiO_2$ layer by chemical vapor deposition on the surface of the wafer. This wafer is then subjected to the anneal heating in the same quartz tube.

It may be apparent that the present invention can be applied not only to the above examples but also to such a process that ions are implanted in wafer at higher dose amounts, short time heating process in which it is to prevent the diffusion of atoms from a metal layer which serves as an ion implantation mask or a barrier layer, to a substrate.

It will be apparent to those skilled in the art that many modifications and variations may be effected without departing from the spirit and scope of the novel concepts of the present invention.

We claim as our invention:

1. A process of manufacturing a semiconductor device comprising the steps of
   (a) implanting impurity ions in a surface of a semimconductor substrate; and
   (b) radiating continuously with a plurality of incoherent lights emitted from a heated refractory metal and having a wave length of 0.4–4$\mu$m and with a beam width wider than said substrate, the intensity of said light beam such that the implanted region is annealed so as to be electrically activated.

2. A process of manufacturing a semiconductor device as claimed in claim 1, in which said substrate is suspended such that both of major surfaces are exposed to the radiation.

3. A process of manufacturing a semiconductor device as claimed in claim 1, in which said 4. A process of manufacturing according to claim 3 wherein said substrate is radiated for a period of 1–15 seconds.

5. A process according to claim 1 wherein said substrate is formed of silicon.

* * * * *

UNITED STATES PATENT AND TRADEMARK OFFICE
CERTIFICATE OF CORRECTION

PATENT NO. : 4,482,393
DATED : November 13, 1984
INVENTOR(S) : Nishiyama et al.

It is certified that error appears in the above-indentified patent and that said Letters Patent is hereby corrected as shown below:

In claim 3, line 2, after "said" insert --implanted surface of said substrate is placed on a wafer which absorbs the light and is suspended with its lower surface exposed to the radiation.--

Signed and Sealed this

Fourth Day of March, 1997

Attest:

BRUCE LEHMAN

Attesting Officer

Commissioner of Patents and Trademarks